United States Patent
Leonardo

(10) Patent No.: US 8,552,798 B2
(45) Date of Patent: Oct. 8, 2013

(54) METHOD FOR OFFSET COMPENSATION OF A SWITCHED-CAPACITOR AMPLIFIER AND SWITCHED CAPACITOR AMPLIFIER ARRANGEMENT

(75) Inventor: Vincenzo Leonardo, Wädenswil (CH)

(73) Assignee: AMS AG, Unterpremstaetten (AT)

( * ) Notice: Subject to any disclaimer, the term of this patent is extended or adjusted under 35 U.S.C. 154(b) by 156 days.

(21) Appl. No.: 13/217,184

(22) Filed: Aug. 24, 2011

(65) Prior Publication Data

US 2012/0068765 A1 Mar. 22, 2012

(30) Foreign Application Priority Data

Aug. 24, 2010 (DE) .......................... 10 2010 035 276

(51) Int. Cl.
*H03F 1/02* (2006.01)
(52) U.S. Cl.
USPC ................................. 330/9; 330/51; 330/109
(58) Field of Classification Search
USPC ............................................. 330/9, 51, 109
See application file for complete search history.

(56) References Cited

U.S. PATENT DOCUMENTS

| | | | | |
|---|---|---|---|---|
| 3,503,049 A | * | 3/1970 | Gilbert et al. | 365/45 |
| 4,112,744 A | * | 9/1978 | Tassano | 73/61.61 |
| 4,543,534 A | | 9/1985 | Temes et al. | |
| 5,796,300 A | | 8/1998 | Morgan | |
| 6,087,897 A | * | 7/2000 | Wang | 330/9 |
| 7,102,557 B1 | * | 9/2006 | Frith | 341/150 |
| 7,639,073 B2 | * | 12/2009 | Deng et al. | 330/9 |
| 8,352,030 B2 | * | 1/2013 | Denison | 607/17 |
| 2009/0273392 A1 | * | 11/2009 | Korobeynikov et al. | 327/551 |

* cited by examiner

*Primary Examiner* — Patricia Nguyen
(74) *Attorney, Agent, or Firm* — McDermott Will & Emery LLP

(57) ABSTRACT

A method for offset compensation of a switched-capacitor amplifier comprises a reset phase ($\phi 1$) and at least one working phase ($\phi 2$). An output voltage (Vout) of the amplifier (amp) is fed according to a damped feedback loop gain (AB(1)) to a first amplifier input (ain1) in the reset phase ($\phi 1$) as a function of an offset voltage (Voff). In the least one working phase ($\phi 2$), an offset of the amplifier (amp) is compensated as a function of the offset voltage (Voff) by superimposing the output voltage (Vout) onto an input voltage (Vin) of the amplifier (amp) according to a loop gain (AB(2)).

11 Claims, 2 Drawing Sheets

METHOD FOR OFFSET COMPENSATION OF A SWITCHED-CAPACITOR AMPLIFIER AND SWITCHED CAPACITOR AMPLIFIER ARRANGEMENT

RELATED APPLICATIONS

This application claims the priority of German application no. 10 2010 035 276.4 filed Aug. 24, 2010, the content of which is hereby incorporated by reference.

FIELD OF THE INVENTION

The present invention relates to a method for offset compensation of a switched-capacitor amplifier and a switched-capacitor amplifier arrangement.

BACKGROUND OF THE INVENTION

Switched-capacitor amplifiers or amplifiers based on the principle of switching capacitors are based on the principle of switching different paths as loops onto the amplifier in different phases by means of suitable switches and alternately charging capacitors and again providing stored charges. This makes possible a time-discrete signal processing that finds a number of applications, for example, in analog/digital converters and sigma-delta modulators.

Many applications of these amplifiers require a high linearity with simultaneous low offset voltage. It is generally possible to meet these requirements only by using high gain factors, as exhibited by operation amplifiers, for example, and providing appropriate circuits for offset compensation. If it is also required that the amplifier be driven rail-to-rail, however, multistage amplifiers are generally needed.

The requirement profile for switched-capacitor amplifiers in turn places high demands on the stability of the amplifier circuit. The central criterion for circuits with feedback is that, at unity gain, a sufficient phase margin remains so that as a whole the phase is always less than $-180°$. Any measure that contributes to improved stability of switched-capacitor amplifiers is thus desirable.

SUMMARY OF THE INVENTION

One object of the present invention is to provide a switched-capacitor amplifier and a method for offset compensation of the switched-capacitor amplifier that has improved stability characteristics.

In one embodiment, the method for offset compensation of a switched-capacitor amplifier comprises a reset phase and at least one working phase. In the reset phase, an output voltage of the amplifier is fed according to a damped loop gain to an input of the amplifier as a function of an offset voltage. In the at least one working phase, an offset of the amplifier is compensated as a function of the offset voltage by superimposing the output voltage onto an input voltage of the amplifier according to a loop gain.

Hereinafter the product of the open loop gain and the feedback factor will be referred to as feedback loop gain. The feedback factor characterizes the amplification of the feedback loop of an amplifier.

The stability criteria for the amplifier as a whole can be more easily satisfied using the damped feedback loop gain. It is true in general that the stability of the amplifier is increased with a decreasing feedback loop gain. In particular, it is advantageous that the damped feedback loop gain can be adjusted in the reset phase in such a manner that the amplifier need not fulfill the stability criteria for unity gain in this reset phase. Therefore the switched-capacitor amplifier remains stable. Instead, the stability criterion is fulfilled if a sufficient phase margin or a phase rotation less than 180° remains for a feedback loop gain with the absolute value of one. This criterion can be fulfilled by means of the damped feedback loop gain.

With the aid of the method for offset compensation, it is possible to operate a switched-capacitor amplifier with reduced stability requirements with an operational amplifier, for example, and thus both save space and achieve a favorable power consumption when the amplifier is integrated into an integrated circuit. Due to the offset compensation, it is also possible to achieve an improved noise behavior, which is particularly advantageous for multistage amplifiers. The method introduced here makes it possible to reduce noise in an output stage of the amplifier during the reset phase. This in turn has a significant effect on the noise behavior of an entire circuit in which the amplifier is operated, for example.

In another embodiment, the damped feedback loop gain is adjusted in the reset phase by damping the feedback loop gain.

The damping of the feedback loop gain has the effect that a feedback loop gain that favorably influences the overall stability of the amplifier is adjusted even during the reset phase. The gain is accordingly selected such that the feedback loop gain of the amplifier as a whole is reduced and the switched-capacitor amplifier can thus be operated stably. Due to the amplification during the reset phase, the amplifier is stable in this phase if a sufficient phase margin is set even with a damped feedback loop gain having an absolute value of one. Thus it is possible even if the phase criterion of $-180°$ is not satisfied at unity gain.

In another embodiment, the frequency of at least one pole of a transfer function of the amplifier is shifted by means of the damped feedback loop gain. This expresses itself in the fact that the frequency of the pole is shifted relative to the signal bandwidth of the reset phase.

With the aid of the damped feedback loop gain, it is further advantageously possible to shift the frequency of the pole of the corresponding amplifier transfer function in such a manner that a corresponding stability criterion for the operation of the overall amplifier is satisfied. The frequency position of the pole is likewise a criterion for judging the stability of an amplifier circuit.

By means of the damped feedback loop gain, the method provides a parameter that permits the pole (or additional poles) to be kept outside the bandwidth of the reset phase. This has the additional effect that the amplifier can still be operated stably even though it may not meet the stability criterion at unity gain under certain circumstances.

In another embodiment, the damped feedback loop gain is adjusted by switching between a first and a second feedback loop.

By using and switching between the first feedback loop and a second feedback loop, it is possible to use the two different feedback loop gains in the respective phases. Thus, for example, a suitable bandwidth can be used in the at least one working phase and a different one in the reset phase. The selection and adjustment are made according to the respective specific application.

In another embodiment, the damped feedback loop gain is adjusted as a function of a quotient of resistance values.

It is advantageously possible to adjust the damping of the feedback loop gain by means of resistance elements such as a voltage divider. Thus it is easily possible to appropriately set a stability criterion by modifying voltages for the feedback.

In another embodiment, the offset voltage is buffered in the reset phase by means of a charge storage means and connected to the input voltage for offset compensation in the at least one working phase.

Switched-capacitor amplifiers have capacitors, which constitute important elements of their functionality. Such capacitors can advantageously be used to store compensation voltages such as the offset voltage during individual phases (here the reset phase), and to use them in another phase (here the at least one working phase) for offset compensation. In this manner it is possible to compensate tolerances of the amplifier induced by the manufacturing and the functional principle, and thereby enable a precise operation of the amplifier.

In another embodiment, the feedback loop gain is adjusted as a function of a quotient of capacitance values of the charge storage means.

The quotient of capacitance values is proportional to the bandwidth of the amplifier and thus also to the feedback loop gain. In this manner the quotient has a direct influence on the stability of the amplifier circuit.

In another embodiment, the reset phase follows the at least one working phase alternately in time.

In one embodiment, a switched-capacitor amplifier arrangement comprises an input and output. An amplifier is coupled by means of a first amplifier input and an offset compensation device to the input, wherein an offset voltage can be supplied to or impressed onto its second amplifier input, and the amplifier has an amplifier output, which is again coupled to the output. A feedback loop is connected in a reset phase or at least one working phase. In the reset phase, the amplifier output is also conductively connected by means of first switches and a damping member to the offset compensation device. In the at least one working phase, the amplifier output is directly coupled electrically by means of second switches to the offset compensation device, the input being likewise coupled by means of second switches to the offset compensation device.

The first and second switches are connected according to the reset phase or the at least one working phase. In the reset phase, the first switches are electrically connected while all of the second switches are synchronously open. The offset voltage present at the second amplifier input is initially supplied via the amplifier output to the offset compensation device by means of the feedback loop. This happens by means of the fact that the output voltage, which is dependent on the offset voltage, is supplied to a damping member. In this manner, a corresponding feedback loop gain in this phase is also damped relative to a corresponding feedback loop gain in the working phase. The offset voltage is stored in the offset compensation device and is available in other phases.

The second switches switch into the at least one working phase, preferably immediately one after another. A changeover generally takes place by opening all of the first switches before the second switches become electrically conductive. In the subsequent at least one working phase, the voltage stored in the offset compensation device is then available at the first amplifier input for offset compensation. At the same time, an input voltage is applied to this first amplifier input. An offset is compensated by superimposing these two voltages. Since the first switches are opened, the damping member is also not integrated into the feedback loop. In the feedback phase, a corresponding feedback loop gain with respect to the damped feedback loop gain results.

An advantageous stability criterion can be implemented in the reset phase of the amplifier arrangement by means of the damped feedback loop gain. In particular, this has the result that the stability of the amplifier in this phase is not limited by a unity gain and a corresponding phase margin. The amplifier can thus be operated unstably in the reset phase at unity gain.

The amplifier arrangement can be integrated in a space-saving and power-saving manner due to these improved stability criteria. Another advantage is that, due to the simultaneously occurring offset compensation, an improved noise behavior is enabled, which is particularly advantageous for multistage amplifier stages. In the proposed amplifier arrangement, the noise in the output stage is also reduced during the reset phase. This has a significant effect on the noise behavior of every circuit in which the amplifier is integrated.

In another embodiment, the damping member comprises a voltage divider that is coupled by means of two first switches to the amplifier output on the one hand and to the offset compensation device on the other. The voltage divider is also set up to adjust a feedback loop gain of the feedback loop.

The voltage divider can advantageously be realized with simple and integrated components. The damping is achieved in this manner by damping voltages at the first amplifier input or reduced them based on the absolute value. In another embodiment, the voltage divider comprises a first and second resistor.

A quotient of the resistance values of the first and second resistors is proportional to the feedback loop gain. The quotient can be selected and adapted depending on the application. A bandwidth during the reset phase and thus also the feedback loop gain can further be adjusted by means of the quotient. The quotient of the resistance values here determines a feedback factor, which in turn enters multiplicatively into the feedback loop gain.

In another embodiment, the offset compensation device comprises a charge storage means.

It is charged during the reset phase with the offset voltage, which is then available for offset compensation in the at least one working phase.

In another embodiment, the charge storage means comprises a first and a second capacitor coupled to one another, whose facing electrodes are connected to the first amplifier input and whose electrodes facing away from one another are connected by means of first switches to a reference potential, preferably ground.

In another embodiment, the amplifier comprises an operational amplifier.

The operational amplifier permits high gain factors and thus contributes to a lower fault susceptibility of the amplifier arrangement. The noise behavior is also positively influenced.

In another embodiment, the first and second switches each comprise transistors.

Transistors as switches simplify the integration of the amplifier arrangement in an integrated circuit.

BRIEF DESCRIPTION OF THE DRAWINGS

The invention will be described in detail below for several exemplary embodiments with reference to figures. Insofar as circuit parts or components correspond to one another in function, a description of them will not be repeated in each of the following figures.

DETAILED DESCRIPTION OF THE DRAWINGS

Figure 1A:
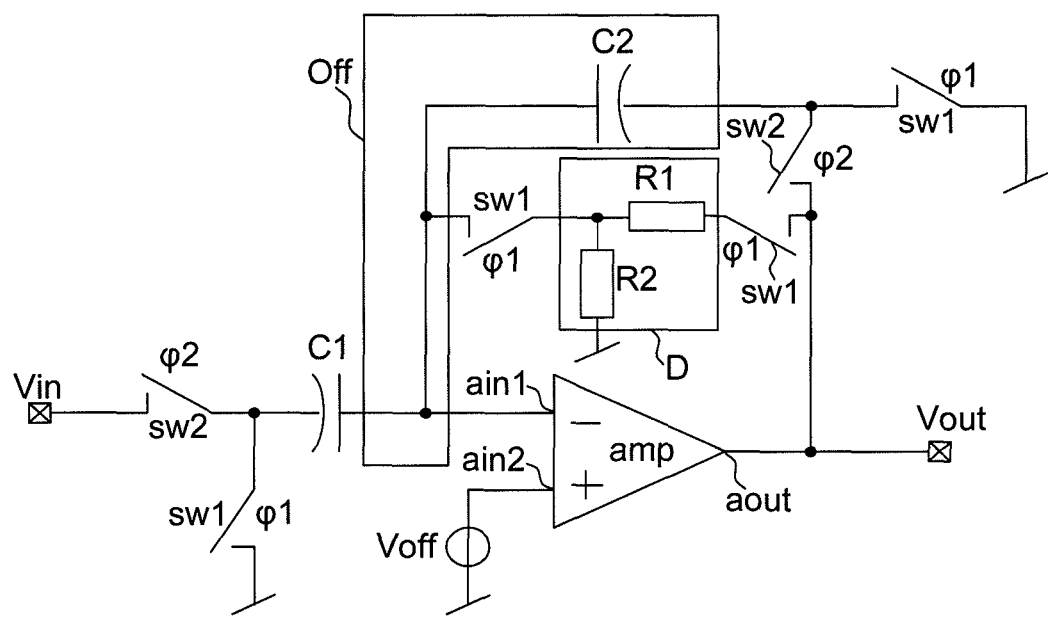
FIG. 1A shows an exemplary embodiment of a switched-capacitor amplifier according to the invention.

FIG. 1A shows an exemplary embodiment of a switched-capacitor amplifier according to the invention. The switched-capacitor amplifier comprises an amplifier amp with a first and second amplifier input ain1, ain2 and an amplifier output aout, as well as a damping member D, an offset compensation device Off and first and second switches sw1, sw2.

One input Vin of the switched-capacitor amplifier is connected via one of the second switches sw2 and a capacitor C1 of the offset compensation device Off to the first amplifier input ain1. The first capacitor C1 is also connected by means of one of the first switches sw1 to a reference potential, preferably ground. An offset voltage Voff, which serves as an equivalent circuit of the actually occurring offset voltage of the amplifier amp, is present at the second amplifier input ain2 of the amplifier. The amplifier output aout is connected to the outlet Vout of the switched-capacitor amplifier.

A first feedback loop feeds the amplifier output aout back to the first amplifier input ain1 via one of the first switches sw1 and the damping member D, which comprises a voltage divider R1, R2, and via another of the first switches sw1.

A second feedback loop feeds the amplifier output aout back to the first amplifier input ain1 via one of the second switches sw2, which is also coupled by means of one of the first switches sw1 to the reference potential, preferably ground, via a second capacitor C2 of the offset compensation device Off.

The switched-capacitor amplifier is operated in a first reset phase φ1 and at least one working phase φ2. The first and second switches sw1, sw2 switch synchronously and complementarily; i.e., either the first or the second switches sw1, sw2 are electrically conductive and the respective other first or second switches sw1, sw2 are open, and vice versa. The switches sw1, sw2 are preferably constructed as transistors in order to allow easy integration of the amplifier circuits on an integrated circuit.

In the reset phase φ1, the offset voltage Voff is present at the second amplifier input ain2. A corresponding output voltage is provided at the amplifier output aout and transferred to the capacitors C1, C2 via the damping member D or the voltage divider with resistors R1, R2. The voltage stored in this manner corresponds to the offset voltage. The first and second capacitor C1, C2 is connected by means of a first switch sw1 to the reference potential (preferably ground) and thus stores the offset voltage Voff.

In the at least one working phase φ2 following the reset phase φ1, an input voltage Vin at the input of the switched-capacitor amplifier is fed to the first amplifier input ain1 and the stored offset voltage Voff is also negatively superimposed on this input ain1. In this manner, an offset compensation similar to auto-zeroing is realized.

Figure 1B:
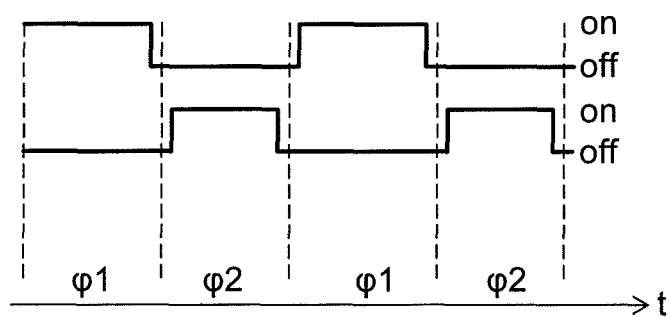
FIG. 1B shows an exemplary embodiment of the time sequence of reset phase and working phases of a switched-capacitor amplifier according to the invention.

FIG. 1B shows an example of a time sequence of the reset phase φ1 and at least one working phase φ2. It is recognizable here that the reset phase φ1 and the at least one working phase φ2 preferably follow one another temporally, but that there is a short period of time in which the two phases, or the first and second switches sw1, sw2, are not simultaneously electrically conductive. This avoids possible short circuits.

One aspect of the amplifier circuit according to FIG. 1A and the time sequence according FIG. 1B is that the reset phase φ1 and at least one working phase φ2 have different feedback loop gains. The latter influence the stability of the overall circuit and are adjusted by the damping member D or the voltage divider R1, R2.

In the reset phase φ1 and the working phase φ2, respective stability criteria determine whether the switched-capacitor amplifier circuit is stable. The feedback loop gains AB can be defined as the central variables for both phases φ1, φ2. They are composed of two factors: a) open loop gain A and b) feedback factor B. The closed feedback loop gain G in this case is $$G = \frac{V_{out}}{V_{in}} = \frac{A}{1 + A \cdot B} \approx \frac{1}{B},$$

with $V_{out}$: output voltage; $V_{in}$: input voltage; A: open loop gain; B: feedback factor. $G = B^{-1}$, to a good approximation, for large gains A.

As the stability criterion for each of the phases φ1, φ2, we have $|A \cdot B| = 1$ and phase shift $< 180°$, i.e., for a feedback loop gain with an absolute value of one, the phase rotation of the feedback loop is less than 180° in order to obtain a stable amplifier circuit.

Figure 2A:
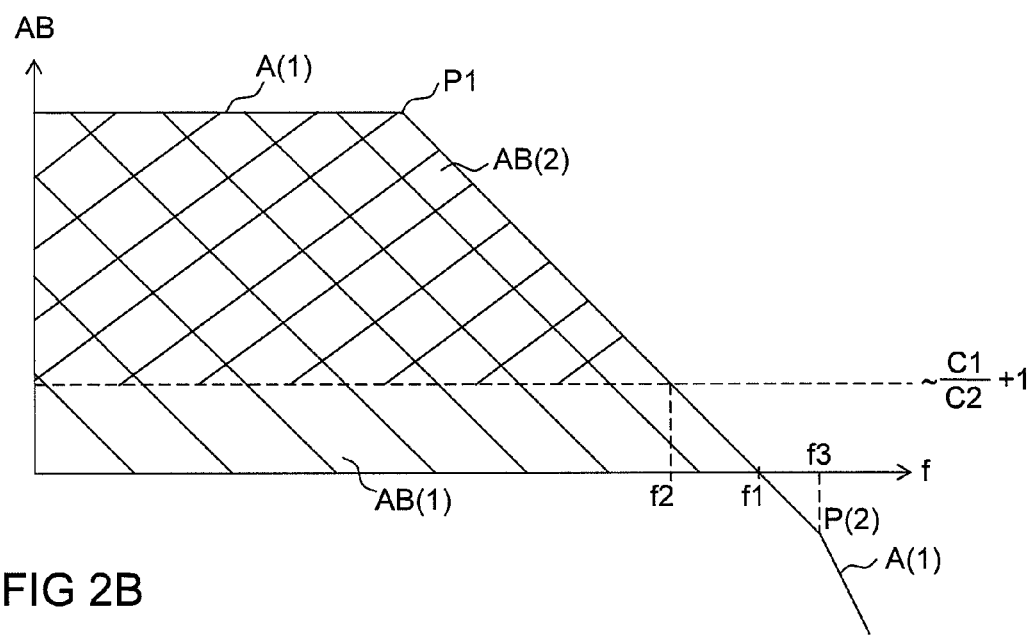
FIG. 2A shows a Bode diagram of a switched-capacitor amplifier without damping of the feedback loop gain during the reset phase according to the invention.

FIG. 2A shows a Bode diagram of a switched-capacitor amplifier according to an embodiment of the invention. The special case is shown in which, for the resistance values R1, R2 of the voltage divider, R1=0 and R2–>∞.

The feedback loop gains AB(1) of the reset phase φ1 and AB(2) of the working phase φ2 are respectively shown as functions of the frequency f. The open loop gain is likewise plotted as a function of the frequency f. The frequency axis is defined by the open loop gain of A=1.

The so-called first and second poles P1, P2 of a circuit transfer function are another factor that provides indications regarding the stability of an amplifier circuit. In general a transfer function describes the dependence of the output signal of a system on its input signal. The second pole P2 of the present circuit is located, for example, at frequency f3. The second pole P2 is a certain distance (gain margin) away from the frequency axis f (unity gain). This likewise represents a criterion for assessing the stability of the circuit.

In the reset phase φ1 there is a feedback loop gain AB(1) designated by the hatched area in FIG. 2A. The bandwidth in the reset phase φ1 is limited by the frequency f1 and is relatively close to the second pole P2. It is fundamentally true that the frequency f3 of the second pole P2 influences the power consumption of the amplifier. The higher the frequency f3, the higher the power consumption as well.

A feedback loop gain AB(2) of the working phase φ2 results as a function of the capacitances C1 and C2. Its bandwidth is determined by the frequency f2 and depends on the ratio of the capacitances C1, C2:

$$f1 \propto 1 + \frac{C1}{C2}.$$

In other words, the charge carriers C1, C2 of the switched-capacitor amplifier influence a stable operation in the at least one working phase φ2.

Figure 2B:
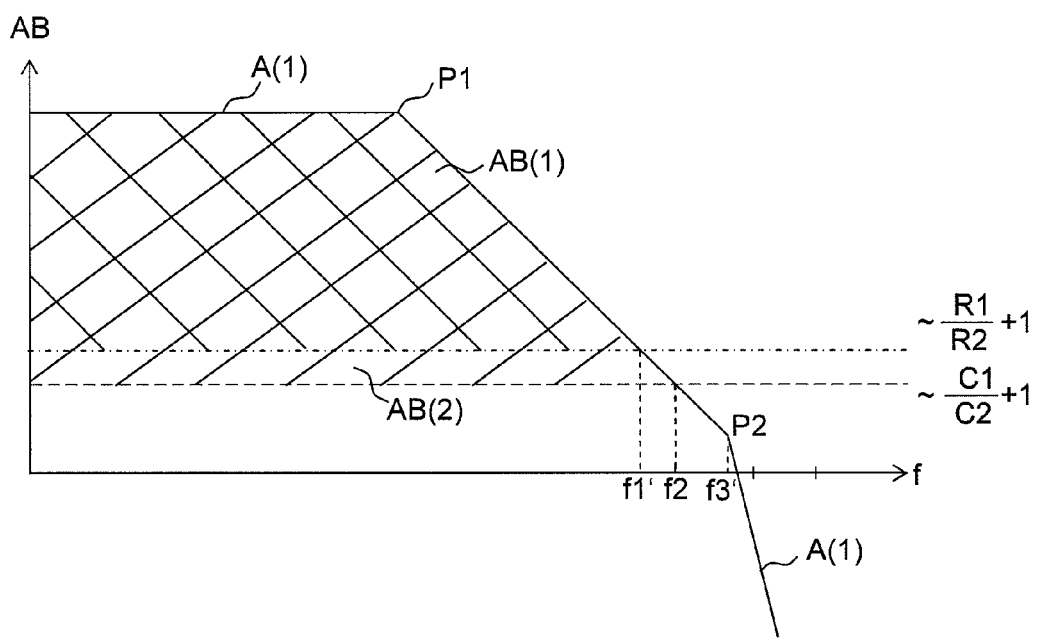
FIG. 2B shows a Bode diagram of a switched-capacitor amplifier with damping according to the invention.

FIG. 2B shows a Bode diagram for a switched-capacitor amplifier according to an embodiment of the invention with a damped feedback loop gain AB(1) in the reset phase φ1.

A damped feedback loop gain AB(1) can be adjusted with the aid of the damping member D or the voltage divider R1, R2. For the resistance values of the voltage divider, R1/R2>0. This damping expresses itself in the reset phase φ1 in several aspects that contribute to an increased stability.

First the bandwidth in the reset phase φ1 is reduced from the frequency f1 to f1'. This makes it possible to dimension the second pole P2 of the amplifier to a lower frequency f3'. In the reset phase as well as in the working phase φ1, φ2, the second pole P2 is the same distance away from the signal bandwidth of the reset phase φ1, because:

$$\frac{f3}{f2} = \frac{f3'}{f1'}.$$

Since f3'>f3, the amplifier can be operated with considerably less power consumption.

In addition, as shown in FIG. 2B, the second pole P2 can lie above the limit marked by unity gain. By means of the damped feedback loop gain AB(1), the circuit is stable despite everything, because the feedback loop gain AB(1) of the reset phase φ1 is limited downward. This limit results from the resistance values R1, R2. We have:

$$f1' \propto 1 + \frac{R1}{R2}.$$

Overall, the stability criteria of the switched-capacitor amplifier are thus simpler to implement. For example, space can be saved in the integration on an integrated circuit and a lower power consumption can also be achieved. Due to the offset compensation, it is also possible to achieve an improved noise behavior, which is particularly advantageous for multistage amplifiers. The concepts introduced here also make it possible to reduce noise in an output stage of the amplifier already during the reset phase φ1. This in turn has a significant effect on the noise behavior of every overall circuit in which the amplifier is used.

The invention is not limited by the description with reference to the working examples. Instead, the invention encompasses any new feature and any combination of features, which especially includes any combination of features in the claims, even if this feature or this combination itself is not mentioned explicitly in the claims or working examples.

I claim:

1. A method for offset compensation of a switched-capacitor amplifier comprising:
   in a reset phase, feeding an output voltage of the amplifier according to a damped feedback loop gain to a first amplifier input as a function of an offset voltage; and
   in at least one working phase, compensating an offset of the amplifier as a function of the offset voltage by superimposing the output voltage on an input voltage of the amplifier according to a feedback loop gain,
   wherein the damped feedback loop gain is adjusted as a function of a quotient of resistance values using a voltage divider.

2. The method according to claim 1, wherein the damped feedback loop gain is adjusted in the reset phase by damping the feedback loop gain.

3. The method according to claim 1, wherein the frequency of at least one pole of a transfer function of the amplifier is shifted by means of the damped feedback loop gain.

4. The method according to claim 1, wherein the damped feedback loop gain is adjusted by changing over between a first and a second feedback loop.

5. A method for offset compensation of a switched-capacitor amplifier comprising:
   in a reset phase, feeding an output voltage of the amplifier according to a damped feedback loop gain to a first amplifier input as a function of an offset voltage; and
   in at least one working phase, compensating an offset of the amplifier as a function of the offset voltage by superimposing the output voltage on an input voltage of the amplifier according to a feedback loop gain,
   wherein the offset voltage is buffered in the reset phase by a charge storage means and is connected in the at least one working phase to the input voltage for offset compensation, and
   wherein the feedback loop gain is adjusted as a function of a quotient of capacitance values of the charge storage means.

6. The method according to claim 1, wherein the reset phase and the at least one working phase follow one another alternately in time.

7. A switched-capacitor amplifier arrangement with an input and an output, comprising:
   an amplifier, having a first amplifier input coupled by an offset compensation device to the input, and a second amplifier input adapted to be supplied with an offset voltage, wherein the amplifier comprises an amplifier output that is connected to the output; and
   a feedback loop wherein the amplifier output is either electrically coupled to the offset compensation device by first switches via a damping member in a reset phase, or directly by second switches in at least one working phase,
   wherein the input is likewise electrically coupled by the second switches to the offset compensation device in the at least one working phase, and
   wherein the damping member comprises a voltage divider that is coupled by at least two of the first switches to the amplifier output and to the offset compensation device, and is configured to adjust a loop gain of the feedback loop.

8. The amplifier arrangement according to claim 7, wherein the voltage divider comprises a first and second resistor, and wherein a quotient of resistance values of the first and second resistors is proportional to the feedback loop gain.

9. A switched-capacitor amplifier arrangement with an input and an output, comprising:
   an amplifier, having a first amplifier input coupled by an offset compensation device to the input, and a second amplifier input adapted to be supplied with an offset voltage, wherein the amplifier comprises an amplifier output that is connected to the output; and
   a feedback loop wherein the amplifier output is either electrically coupled to the offset compensation device by first switches via a damping member in a reset phase, or directly by second switches in at least one working phase,
   wherein the input is likewise electrically coupled by the second switches to the offset compensation device in the at least one working phase,
   wherein the offset compensation device comprises a charge storage means, and
   wherein the charge storage means comprises a first and a second capacitor coupled to one another, whose facing electrodes are connected to the first amplifier input and whose electrodes facing away from one another are connected by the first switches to a reference potential.

10. The amplifier arrangement according to claim 7, wherein the amplifier comprises an operational amplifier.

11. The amplifier arrangement according to claim 7, wherein at least one of the first switches or the second switches comprises one or more transistors.

* * * * *